United States Patent
Dvorsky

[19]

[11] Patent Number: 5,886,864

[45] Date of Patent: Mar. 23, 1999

[54] SUBSTRATE SUPPORT MEMBER FOR UNIFORM HEATING OF A SUBSTRATE

[75] Inventor: Randolph Wayne Dvorsky, San Jose, Calif.

[73] Assignee: Applied Materials, Inc., Santa Clara, Calif.

[21] Appl. No.: 759,795

[22] Filed: Dec. 2, 1996

[51] Int. Cl.$^6$ .................................................. H02N 13/00
[52] U.S. Cl. ......................................... 361/234; 279/128
[58] Field of Search ..................................... 361/234, 233; 279/128; 219/543, 539, 540, 541, 542, 544

[56] References Cited

U.S. PATENT DOCUMENTS

| | | | |
|---|---|---|---|
| 3,694,627 | 9/1972 | Blatchford et al. | 219/543 |
| 4,962,441 | 10/1990 | Collins | 361/234 |
| 5,039,845 | 8/1991 | Clough et al. | 219/543 |
| 5,078,851 | 1/1992 | Nishihata et al. | 204/298.34 |
| 5,252,809 | 10/1993 | Demin | 219/543 |
| 5,306,895 | 4/1994 | Ushikoshi et al. | 219/385 |
| 5,315,473 | 5/1994 | Collins et al. | 361/234 |
| 5,366,002 | 11/1994 | Tepman | 165/1 |
| 5,376,213 | 12/1994 | Ueda et al. | 156/345 |
| 5,436,790 | 7/1995 | Blake et al. | 361/234 |
| 5,511,799 | 4/1996 | Davenport et al. | 277/236 |
| 5,581,874 | 12/1996 | Aoki et al. | 29/825 |
| 5,591,269 | 1/1997 | Arami et al. | 118/723 R |

FOREIGN PATENT DOCUMENTS

| | | | |
|---|---|---|---|
| 0 467 623 A2 | 1/1992 | European Pat. Off. | C23C 16/54 |
| WO 90/13687 | 11/1990 | WIPO | C30B 25/10 |

*Primary Examiner*—Fritz Fleming
*Attorney, Agent, or Firm*—Patterson & Associates

[57] ABSTRACT

The present invention provides a heating member that can be molded inside cavities, between individual members or encapsulating components to provide efficient and uniform heat transfer. The invention may be used to advantage around pipes or vessels for heating the contents, within members for providing heat to adjacent members or workpieces, and in any other application where heat can be more efficiently or uniformly provided by intimate contact with a member to be heated, whether or not the member to be heated is the ultimate member or workpiece requiring heat. In one aspect of the invention, a heating member is disposed within an electrostatic chuck to provide direct conductive heating of the electrostatic chuck and, ultimately, a silicon wafer up to temperatures as high as about 600 degrees Celsius. The preferred electrostatic chuck incorporates a composite heating element intimately molded within the electrostatic chuck, wherein the composite is resistively heated over a large surface area of the electrostatic chuck.

9 Claims, 4 Drawing Sheets

SUBSTRATE SUPPORT MEMBER FOR UNIFORM HEATING OF A SUBSTRATE

FIELD OF THE INVENTION

The present invention relates to an apparatus for substantially uniform and repeatable heat transfer to a substrate used in semiconductor processing. In particular, the present invention relates to a substrate support member upon which the substrate sets during processing designed to provide uniform heat transfer to the entire surface of the substrate during processing.

BACKGROUND OF THE INVENTION

In the manufacture of many electronic or electrical components such as integrated circuits, there is a need to deposit thin films on substrates. Materials such as aluminum, titanium, tungsten, tantalum, tantalum nitride, cobalt, and silica may be deposited on ceramic, glass or silicon-derived substrates using physical vapor deposition (PVD) processes such as a physical sputtering process. Another method of deposition of solid materials upon a substrate is chemical vapor deposition (CVD), wherein a solid material is deposited from a gaseous phase onto a substrate by means of a chemical reaction. The deposition reaction involved is generally thermal decomposition, chemical oxidation, or chemical reduction. The CVD process can be used to deposit many elements and alloys as well as compounds including oxides, nitrides and carbides. The thin film deposited may be subsequently etched or otherwise fabricated into circuits and/or other electrical components.

In a typical PVD process, such as physical sputtering, a low pressure atmosphere of an ionizable gas such as argon or helium is introduced in a vacuum chamber. The pressure in the vacuum chamber is reduced to about $10^{-6}$ to about $10^{-10}$ Torr, after which argon, for example, is introduced to produce an argon partial pressure from about 0.0001 Torr (0.1 mTorr) to about 0.020 Torr (20 mTorr). Two electrodes, a cathode and an anode, are generally disposed in the vacuum chamber to generate a plasma in the chamber. The cathode is typically made of the material to be deposited or sputtered, and the anode is generally formed by the enclosure (particular walls of the vacuum chamber, or the support member upon which the substrate sits, for example). At times, an auxiliary anode may be used or the article to be coated may serve as the anode. Typically, a high voltage is applied between these two electrodes to strike a plasma in the chamber, and the substrate to be coated is disposed upon a platform positioned opposite the cathode.

The platform upon which the substrate sits during processing is often heated and/or cooled, and heat is transferred between the platform and the substrate, to assist in obtaining the desired film coating upon the substrate. As device geometries shrink, the coating is preferably a thin film which needs to have an even thickness, controlled stress and the desired material morphology, while providing excellent step coverage. To obtain such a thin film coating, it is desirable to maintain the substrate at a uniform temperature within a few degrees Celsius. Preferably, the temperature is near but below the melting point of the material from which the film is being formed. It is very important that the substrate temperature be repeatable each time a given process is carried out. Thus, the heat transfer between the platform and the substrate must be uniform and repeatable.

In a typical CVD process, to facilitate uniformity of deposition coverage of the substrate, the deposition is carried out in a vacuum chamber under a partial vacuum. The pressure in the CVD chamber commonly ranges from about 0.070 Torr (for plasma enhanced CVD) to about 200 Torr (for "high pressure" CVD). As reactive gases are fed into the chamber, they are directed via a pressure differential (created by the vacuum system applied to the CVD chamber) across the surface of the substrate to be coated in a manner which provides an even flow of reactant gases over the substrate surface. The deposition is also controlled by the temperature of the surfaces which contact the reactant gases. Thus, it is critical that the substrate surface be controlled at a desired uniform temperature.

The substrate support member upon which the substrate sits is commonly used as the means for transferring heat to and from the substrate. Radiant, inductive, or resistance heating are the most commonly used techniques to heat a support platform, but it is also possible to circulate a heat transfer fluid internal to the support platform to provide heating or cooling of the support platform.

When the pressure in the process chamber is about 5 Torr or less, convective/conductive heat transfer between the substrate and the platform becomes impractical. Since the substrate and the platform typically do not have perfectly level surfaces which would enable sufficiently even heat transfer by direct conduction, it is helpful to provide a heat transfer fluid between the platform and the substrate, to assist in providing even heat transfer between the support platform and the substrate. Preferably the heat transfer fluid used between the substrate and its support platform is in constant movement (flowing) to provide yet another improvement in the uniformity of the heat transfer. The heat transfer fluid commonly used between the support platform and the substrate is one of the gases used in the sputtering, CVD or etch process.

A frequently-used substrate support platform design is one having a substrate contact surface which is principally flat-faced with openings and/or exposed channels spaced at various locations upon this surface. The fluid used to transfer heat between the platform and the substrate flows through the openings or is fed through an opening into exposed channels in the flat-faced surface of the platform. The heat transfer fluid can be provided to the platform from a fluid supply source via tubing which connects the fluid supply source to the platform. The platform itself may include various means for directing fluid to the openings and/or exposed channels in the surface of the platform.

In operation of a semiconductor processing apparatus, the substrate to be processed is typically mechanically or electrostatically clamped along its edges to the substrate-facing surface of the support platform. The fluid used to transfer heat between the support platform and the substrate is typically a gas such as helium, argon, hydrogen, carbon tetrafluoride, or hexafluoroethane, for example, or other suitable gas that is a good heat conductor at low pressure. This heat transfer fluid is applied through openings or supplied into exposed channels in the substrate-facing surface of the support platform.

Electrostatic clamping of semiconductor substrates on a support platform, such as a pedestal, is typically accomplished with an electrostatic chuck. An electrostatic chuck typically includes at least a dielectric layer and an electrode, which may be located on a chamber pedestal or formed as an integral part of the chamber pedestal. A semiconductor substrate is placed in contact with the dielectric layer, and a direct current voltage is placed on the electrode to create the electrostatic attractive force to adhere the substrate on the chuck. An electrostatic chuck is particularly useful in vacuum processing environments where the maximum differential pressure which can be established between the low pressure chamber and the face of the chuck is insufficient to firmly grip the substrate on the chuck, or where mechanical clamping of the substrate is undesirable.

Although a simple electrostatic chuck may be formed from as little as a single dielectric layer and an electrode, the materials and construction of an electrostatic chuck will vary from one application to another, particularly in high temperature or low temperature processes. A typical low temperature electrostatic chuck is configured as a thin laminate member supported on a chamber pedestal to receive and support the substrate. The laminate member preferably includes an electrode core, preferably a thin copper member, which is sandwiched between upper and lower dielectric layers of an organic material such as polyamide. An adhesive such as polyamide may be used to attach the polyamide layers to the electrode core. The lower dielectric layer of the laminate member is attached directly to the upper surface of the chamber pedestal, usually with an adhesive such as polyamide, and the upper dielectric layer forms a planar surface on which the substrate is received. To prevent exposure of the electrode to the chamber environment, the upper and lower dielectric layers and adhesive layers extend beyond the edges of the electrode core, and are interconnected at that location to form a dielectric barrier between the electrode core and the chamber environment. To supply the high voltage potential to the electrode, a strap, formed as an integral extension of the laminate member, extends through or around the edge of the pedestal and connects to a high voltage connector on the underside of the pedestal.

Low temperature electrostatic chucks used in certain physical vapor deposition processes are made of a dielectric coated aluminum shell. In both high and low temperature electrostatic chucks, the aluminum shell will typically enclose equipment such as a thermocouple, electrical conductor leads to the electrostatic chuck and a heat transfer gas supply line. When a heating element is included in the shell, the heater must be configured to avoid interference with the other equipment. Unfortunately, the necessary heater configurations do not provide uniform heating of the substrate support platform and, ultimately, the substrate. Temperature nonuniformity of the substrate leads to nonuniform film deposition.

Therefore, there remains a need for a substrate support member that can provide substantially uniform heating over the surface of a substrate and allow for equipment, sensors, wires or the like to pass through or be positioned within the support member. It would be desirable to have a substrate support member with an integral electrostatic chuck in an intimate thermal relationship with a heater. Furthermore, it would be desirable to have a heater that would provide substantially uniform and repeatable heating of a substrate surface.

SUMMARY OF THE INVENTION

The present invention provides a substrate support member for providing heat to a substrate during a fabrication process, the substrate support comprising a rigid body having a generally planar top surface for supporting a substrate thereon and an annular flange extending downwardly from the outer perimeter of the generally planar top surface and defining a cavity therebetween, the body comprising a material compatible with the process environment; an electrically resistive heating member intimately molded within the cavity of the body; and electrically conductive leads for coupling the electrically resistive heating member to a voltage source.

The present invention further provides a substrate support member for providing heat to a substrate during a vacuum process, the substrate support comprising an electrostatic chuck having an electrode, an electrical insulator disposed on the electrode configured to receive a substrate thereon; a moldable, thermally conductive material formed having a heating member disposed therein, said conductive member located adjacent to a surface of the electrostatic chuck; and an electrical conductor for coupling the heating member to a voltage source.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

FIG. 3 is a cross-sectional view of a support member of the present invention having an electrode and electrically resistive core with passages and channels for a backside gas, electrically conducting wires, and the like.

DETAILED DESCRIPTION OF THE INVENTION

Figure 1:
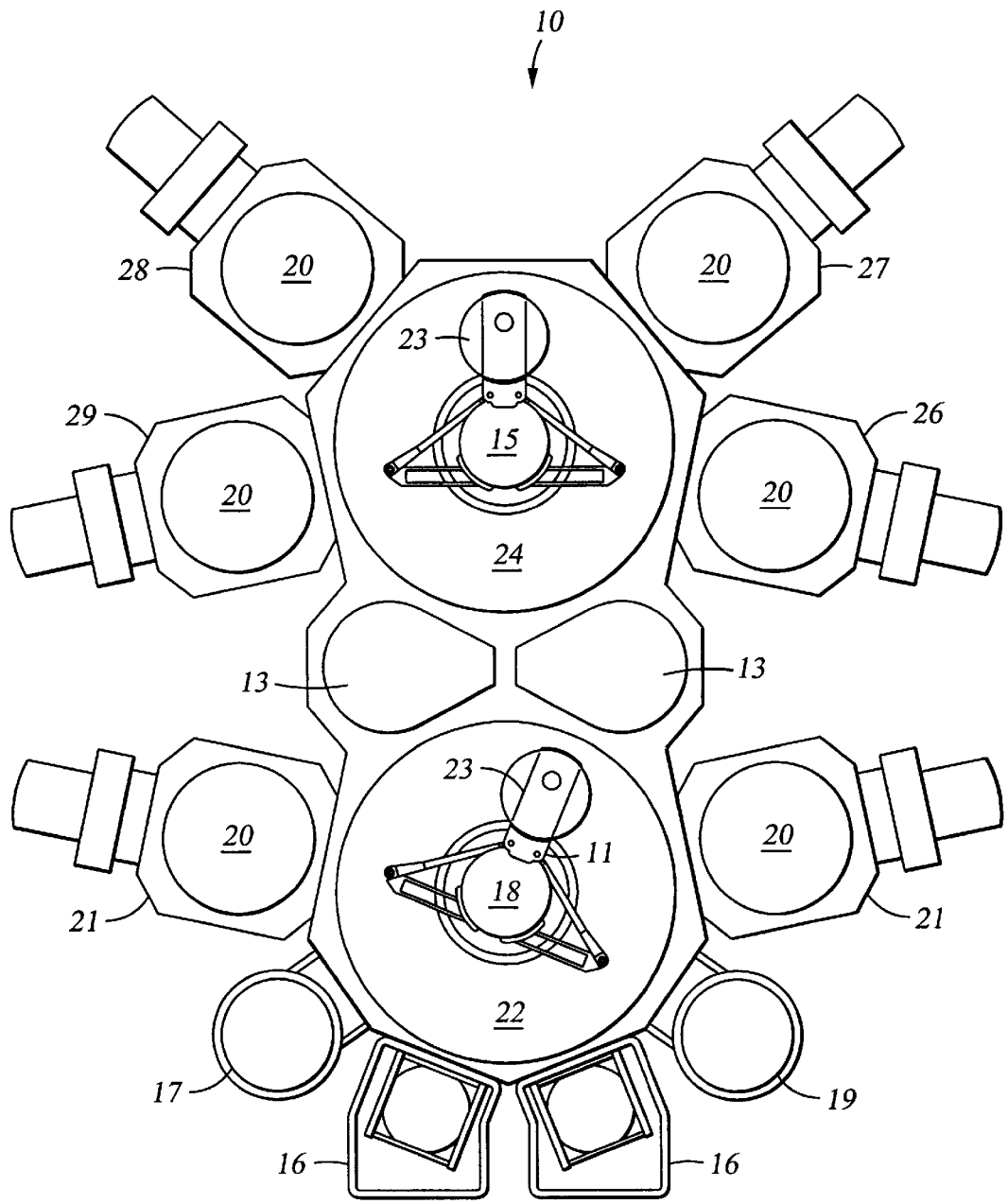
FIG. 1 is a top plan view of a multiple chamber integrated circuit processing system 10 in which a support member of the present invention may be used to advantage.

The present invention provides a method and apparatus including an electrically resistive member for generating heat and providing efficient and uniform heat transfer to at least a first object. More particularly, the invention provides an electrostatic chuck providing more uniform heating to a substrate positioned on a substrate support member in a vacuum processing chamber. Even more particularly, the electrostatic chuck may be incorporated into the substrate support pedestal and have a heating member in intimated contact with therewith for providing more uniform heat conduction to a substrate during processing. In one aspect of the invention, a heating member is disposed within an electrostatic chuck to provide direct conductive heating of the electrostatic chuck. The preferred electrostatic chuck of the present invention incorporates a composite heating media intimately molded within the electrostatic chuck, wherein the composite is resistively heated over a large surface area of the electrostatic chuck.

In one aspect of the present invention, a composite heating media is comprised of electrically conductive particles or fragments suspended in a thermally conductive material in close proximity so as to create a material with specific resistive qualities. The heating media can be molded inside cavities, between individual members or encapsulating components to provide efficient and uniform heat transfer between. The invention may be used to advantage around pipes or vessels for heating the contents, within members for providing heat to adjacent members or workpieces, and in any other application where heat can be more efficiently or uniformly provided by intimate contact with a member to be heated, whether or not the member to be heated is the ultimate member or workpiece requiring heat.

The present invention eliminates the mechanical connections found in presently available heaters between the electrostatic chuck and a heater housed within the lower portion of the substrate support pedestal. Mechanical connections between two surfaces seldom mate perfectly due to variations and defects in the surfaces and, therefore, provide inefficient and nonuniform thermal conduction between the two surfaces. By contrast, the heating element of the present invention is cured or otherwise formed within the backside of the electrostatic chuck to obtain substantially void-free contact.

According to another aspect of the invention, a thermally conductive material is formed around a heating member and positioned adjacent to a surface of an electrostatic chuck. The thermally conducting material should be a moldable material to form a substantially void-free, thermally conducting path from the heating member, such as an electrically resistive coil, to the heat transfer surface of the electrostatic chuck. Where the heating member is an electrically resistive member, the material should hold and secure the member as well as allow electrically conducting leads to pass therethrough. Where a backside gas is used to transfer heat from the electrostatic chuck to a substrate, the material can be molded to form passages through the thermally conductive material to the top surface of the electrostatic chuck. This aspect of the invention provides the advantage of efficiently and uniformly conducting heat from the heating member to adjacent members.

According to yet another aspect of the invention, the thermally conducting material fills a cavity within the electrostatic chuck and has sufficient electrical resistivity to heat the electrostatic chuck when a voltage is applied thereto. The thermally conducting, electrically resistive material is still formed around certain passages or members of the electrostatic chuck, but the material eliminates the need for a separate heating coil because the voltage source applied directly thereto causes the resistive material to heat. This aspect of the invention has the advantage of generating heat directly adjacent to the surface of the electrostatic chuck and directly adjacent any passages or members within the electrostatic chuck to provide substantially uniform heating across the area of the electrostatic chuck. A plurality of passages can be formed within the heating media without damaging the heating media or causing nonuniform heating.

The present invention is useful for any type of vacuum deposition chamber for semiconductor fabrication, such as a physical vapor deposition (PVD) chamber or a chemical vapor deposition (CVD) chamber for depositing a conductor, semiconductor or dielectric film on a substrate. Furthermore, it should be noted that the present invention may be used to advantage with any type or style of electrostatic chuck or the heat transfer surface of any substrate support pedestal including a vacuum chuck. The invention will be described below in a preferred implementation within a pedestal-mounted electrostatic chuck in a conventional PVD chamber for depositing a metal film on a semiconductor substrate. It should be recognized that the invention may be implemented with equal advantage in either a single chamber system or an integrated multiple chamber system or cluster tool. Before describing the features of the invention, the components of a preferred cluster tool, a conventional PVD chamber and the fabrication process occurring therein are described.

An Integrated Processing System

Now referring to FIG. 1, a top plan view of a multiple chamber integrated circuit processing system (or cluster tool) 10 is shown having a plurality of chambers with substrate support members 20 of the present invention positioned therein. Typically, substrates 23 are introduced and withdrawn from the cluster tool through a cassette loadlock 16. A robot 18 having a blade 11 is located within the cluster tool 10 to move the substrates 23 through the cluster tool. One robot 18 is typically positioned in a buffer chamber 22, typically operated at a pressure between about $10^{-3}$ and about $10^{-7}$ torr, to transfer substrates between a cluster or group of chambers, for example a cassette loadlock 16, degas wafer orientation chamber 17, preclean chamber 19, PVD TiN ARC chamber 21 and cooldown chamber 13. A second robot 15 is located in the transfer chamber 24 to transfer substrates 23 to and from a second cluster or group of chambers, for example the cooldown chamber 13, coherent Ti chamber 26, CVD TiN chamber 27, CVD Al chamber 28 and PVD AlCu processing chamber 29. The transfer chamber 24 in the integrated system 10 is preferably maintained at a vacuum pressure between about $10^{-7}$ and about $10^{-8}$ torr. The cluster or group of chambers in FIG. 1 comprise an integrated processing system capable of both CVD and PVD processes in a single cluster tool. The specific configuration and combination of chambers is merely illustrative and should not be taken as limiting the application of the present invention.

An exemplary cluster tool is disclosed by Tepman et al. in U.S. Pat. No. 5,186,718, entitled "Staged-Vacuum Wafer Processing System and Method," which issued on Feb. 16, 1993, which is hereby incorporated by reference.

Conventional Processing Chamber Components

Figure 2:
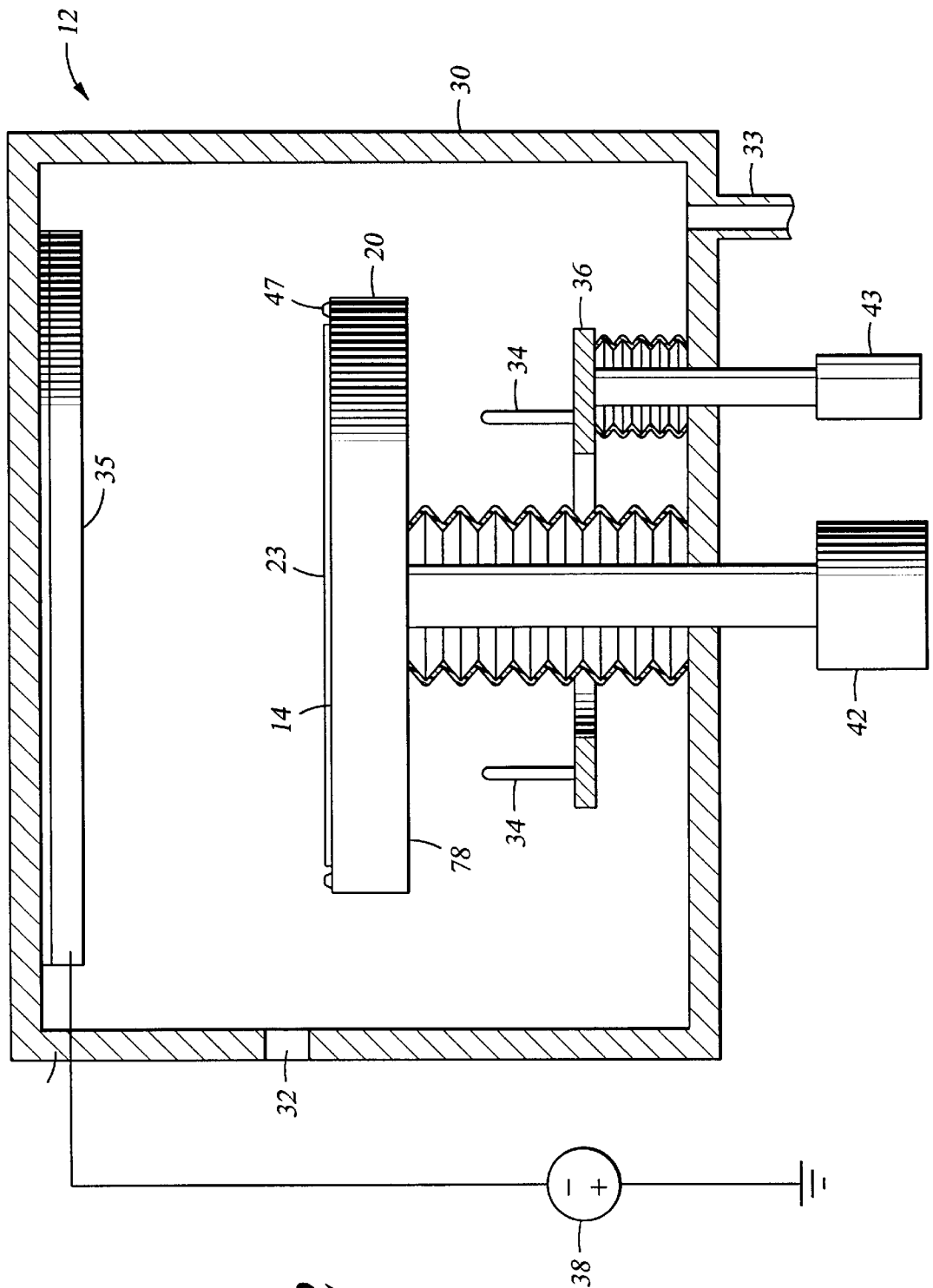
FIG. 2 is a partial sectional view of an exemplary PVD processing chamber having a support member of the present invention disposed therein.

Referring now to FIG. 2, a simplified sectional view of a processing chamber 12 is shown incorporating an electrostatic chuck of the present invention. The chamber 12 generally includes a chamber enclosure wall 30, having at least one gas inlet 32 and an exhaust outlet 33 connected to an exhaust pump (not shown). A substrate support pedestal 20 is disposed at the lower end of the chamber 12 to support a substrate thereon during processing. A target 35 is received at the upper end of the chamber 10 to provide a deposition material to be deposited on the substrate. The target 35 is electrically isolated from the enclosure wall 30. The enclosure wall 30 is preferably grounded and a negative voltage is maintained on the target 35 with respect to the grounded enclosure wall 30 in order to strike and maintain a plasma within the chamber.

In preparation for receiving a substrate 23 into the chamber 12, the substrate support pedestal 20 is lowered by a drive mechanism 42 so that the bottom of the pedestal 20 is close to a wafer pin positioning platform 36 having vertically slidable pins 34. The pedestal 20 generally includes three vertical bores (not shown) through which the vertically slidable pins 34 extend. When the pedestal 20 is in the lowered position just described, the upper tip of each pin 34 protrudes above the upper surface of the pedestal 20. The upper tips of the pins define a plane parallel to the upper surface of the pedestal 20 to receive a substrate thereon to be positioned on the pedestal 20.

The robot arm 19 (shown in FIG. 1) carries a substrate 23 into the chamber 12 and places the substrate above the upper tips of the pins 34. A lift mechanism 43 moves the pin platform 36 upwardly, to place the upper tips of the pins 34 against the underside of the substrate 23 and additionally lift the substrate off the robot blade 19. The robot blade then retracts from the chamber 12 and the lift mechanism 42 raises the pedestal 20 so that the top surface of the pedestal comes into contact with the underside of the substrate, lifting it further until an optimum distance from target is achieved.

At this point, the film deposition process can begin. In the case of the exemplary PVD chamber 12 shown in FIG. 2, a PVD process gas (typically argon) is supplied to the chamber through the gas inlet 32, and a DC power supply 38 applies a negative voltage to the PVD target 35. The voltage excites the argon gas to a plasma state, and argon ions bombard the negatively biased target 35 to sputter material off the target. The sputtered material then deposits on the substrate 23. After a film layer has been deposited on the substrate 23, the substrate is removed from the chamber 12 by reversing the sequence of steps by which it was carried into the chamber 12.

Novel Features of the Support Member

Figure 3:
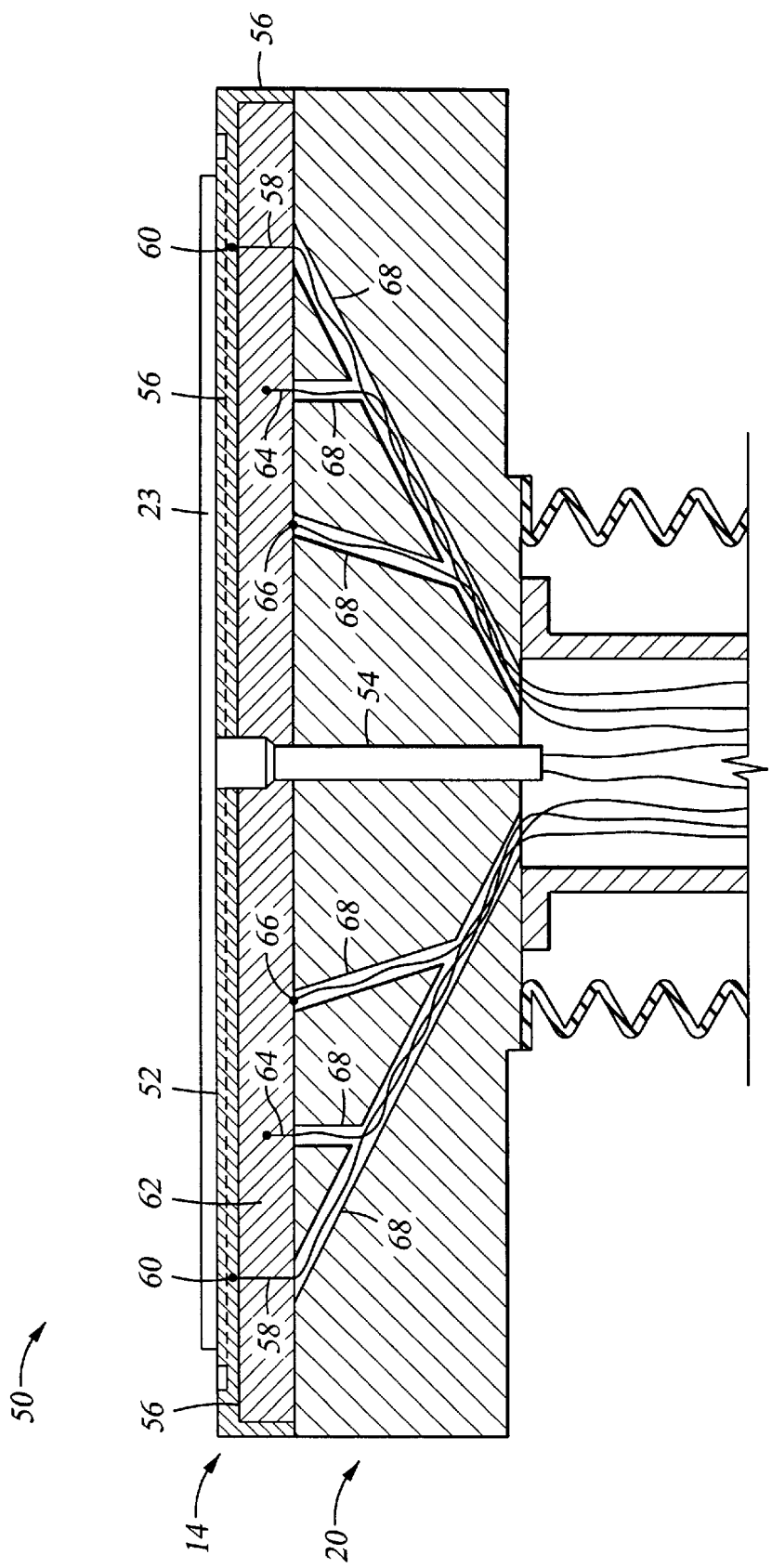

Now referring to FIG. 3, a support member 50 is shown having an electrostatic chuck 14 mounted to or forming the top portion of the substrate support pedestal 20. The electrostatic chuck 14 may contain channels 52 formed in the top surface of the electrostatic chuck 14 which cooperate with the substrate 23 to allow controlled passage of a heat transfer gas or masking gas between the electrostatic chuck and the substrate. The gas is supplied to the channels 52 through a supply passage 54 extending through the electrostatic chuck 14 and the support pedestal 20.

The electrostatic chuck 14 includes a body 56 comprised of an electrode coated with a dielectric material. Electrically conducting wires 58 couple the electrodes to a voltage source at point 60. A thermally conducting material 62 is molded within the cavity in the bottom of an electrostatic chuck defined by the body 56. The thermally conducting material 62 may be any moldable material that has sufficient thermal conductance at operating temperatures for efficient heat transfer to the electrostatic chuck and the substrate. Note that the support member 20 may be a hollow member supporting the body 56 only at the circumference.

Where the thermally conducting material is intended to form a composite heating element, the preferred material includes electrically conducting fragments, such as carbon fibers, metal shavings or similar material, in sufficient amount to allow adjacent fragments within the composition to contact each other and thereby provide electrical resistance heating. The fragments may be bound in a non-electrically conducting, but preferably thermally conducting, binder material that is moldable or curable into a desired shape or defined cavity. In order for the composite heating element 62 to generate heat, electrically conducting wires 64 having leads embedded within the composite 62 are provided to complete an electrical circuit by which electricity is passed through the composite 62. Members or components of any type, such as electrical connections or terminals, sensors, a cooling manifold or tube, may extend within or on the surface of the composite. Specifically, thermocouples or other temperature measuring devices 66 may be disposed within or on the surface of the composite 62 to monitor the temperature of the composite.

Each of the electrically conducting wires, such as wires 64, and other members, such as passage 54, communicate with passages 68 through the support member 20 leading out of the chamber 12 (see FIG. 2) In this manner, voltage sources, gases and the like can be located outside of chamber 12.

Figure 4:
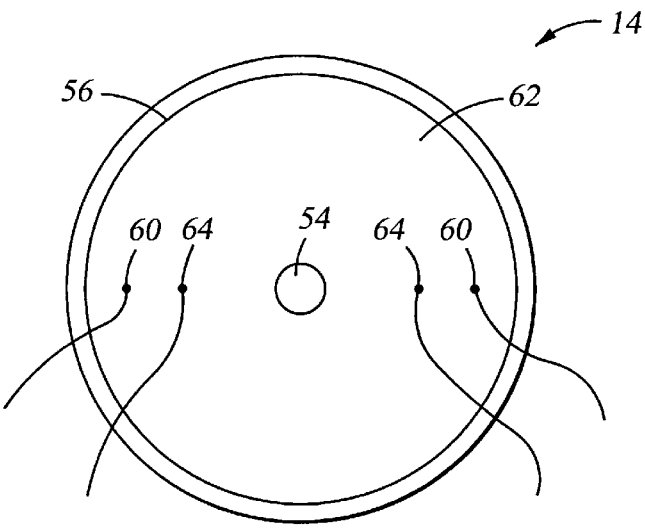
FIG. 4 is a bottom view of a first embodiment of a support member of the present invention having a composite heating media molded into the body directly below the electrodes of the electrostatic chuck.

Now referring to FIG. 4, a bottom view of the electrostatic chuck 14 of FIG. 3 is shown having a composite heating element 62 molded within the body 56. Electrically conducting wires 60 and 64 are molded into the composite 62 to couple voltage sources to the electrode of the electrostatic chuck and the composite 62 comprising the heating element. The passage 54 is formed through the electrostatic chuck 14 for passage of heat transfer gases to the top surface of the electrostatic chuck. Any number of terminals can be located strategically to provide the best temperature uniformity over the chuck surface.

Figure 5:
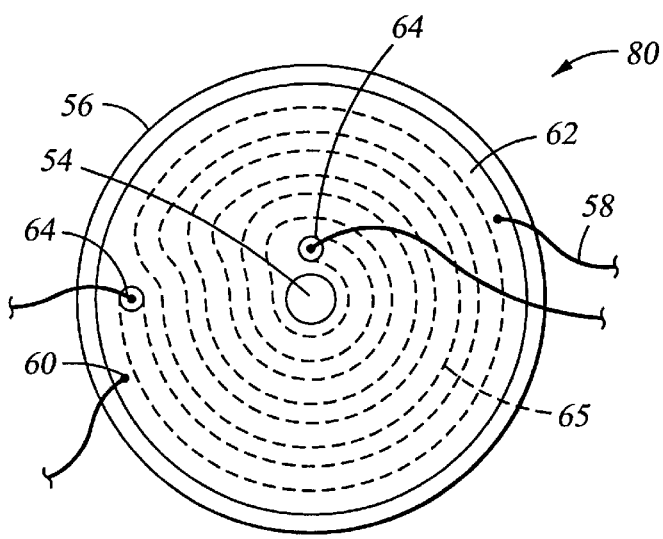
FIG. 5 is a bottom view of a second embodiment of a support member of the present invention having a discrete heating coil disposed in a moldable thermally conducting material.

Now referring to FIG. 5, a bottom view of a second embodiment of the electrostatic chuck 80 is shown having a discrete heating coil 65 disposed in a moldable, thermally conducting material 62. Electrical wires 64 connect a voltage source to the ends of the electrically resistive heating coil 65 to provide energy sufficient to heat the coil. The coil 65 may take any shape that covers the area of the electrostatic chuck, but the shape chosen will limit where the wires 60, 64 and passage 54 can be located. A second coil may be used to provide additional heating capability, if needed.

Figure 6:
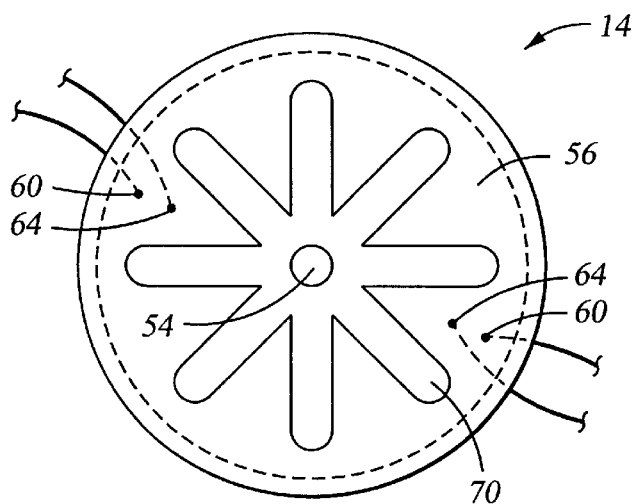
FIG. 6 is a top view of a support member of the present invention having radial channels formed therein for passage of a heat transfer fluid.

Now referring to FIG. 6, a top view of a preferred electrostatic chuck is shown having radial channels 70 for passage of a heat transfer gas over the surface of body 56. The channels 70 may take any shape known to be useful in the art.

As previously stated, the thermally conducting and optionally electrically resistive material may be utilized to provide a heating member having intimate contact with adjacent members to promote efficient and uniform heat transfer through the heating member. The invention is useful in many applications where uniform heating is beneficial. While the present invention has been discussed primarily in the context of an electrostatic chuck, the invention may find additional applications through vacuum processing chambers and associated apparatus. Particularly, the invention is equally well suited for use in vacuum chucks which supply a vacuum to the bottom surface of substrates to secure them to the substrate support pedestal. A flat pedestal may be used with the present invention to achieve uniform heat distribution as well. It is also possible to capture the wafer using a weighted clamping mechanism that holds the wafer in place to allow the use of a back side gas.

While the foregoing is directed to the preferred embodiment of the present invention, other and further embodiments of the invention may be devised without departing from the basic scope thereof. The scope of the invention is determined by the claims which follow.

What is claimed is:

1. A substrate support member for heating a substrate comprising:

a) a rigid body having an upper surface for supporting a substrate thereon and a lower surface defining a cavity therein;

b) a composite heating media filling the cavity in the lower surface of the body, the composite heating media consisting of electrically conductive fragments suspended in a thermally conductive material;

c) a thermocouple molded into the composite heating media; and d) electrically conductive leads for coupling the composite heating media to a voltage source.

2. The substrate support member of claim 1, wherein the thermally conductive material comprises a curable material.

3. The substrate support member of claim 1, wherein the composite heating media is formed about the thermocouple.

4. The substrate support member of claim 1, wherein the composite heating media is formed about a passageway for delivery of backside gas through the composite heating media to the substrate.

5. The substrate support member of claim 4, wherein the backside gas is delivered to the electrostatic chuck at interface between the substrate support member and the substrate.

6. A substrate support member for heating a substrate, comprising:

a) an electrostatic chuck having an electrode, an electrical insulator disposed on the electrode configured to receive a substrate thereon, and a bottom portion having a cavity;

b) a composite heating media molded within the cavity, the composite heating media consisting of electrically conductive fragments suspended in a thermally conductive material;

c) a thermocouple molded into the composite heating media; and d) electrically conductive leads for coupling the composite heating media to a voltage source.

7. The substrate support member of claim 6, further comprising a passage through the thermally conductive material and the electrostatic chuck to deliver heat transfer gas to the face of the electrostatic chuck.

8. The substrate support member of claim 7, wherein the electrode has conductive leads passing through the thermally conductive material.

9. The substrate support member of claim 7, wherein the composite heating media fills the cavity.

* * * * *